United States Patent [19]

Itoh et al.

[11] Patent Number: 4,533,831
[45] Date of Patent: Aug. 6, 1985

[54] NON-MASS-ANALYZED ION IMPLANTATION

[75] Inventors: Haruo Itoh, Hino; Katsumi Tokiguchi, Machida; Terunori Warabisako; Tadashi Saitoh, both of Tokyo; Takashi Tokuyama, Higashikurume, all of Japan

[73] Assignee: Hitachi, Ltd., Tokyo, Japan

[21] Appl. No.: 477,375

[22] Filed: Mar. 21, 1983

[30] Foreign Application Priority Data

Mar. 24, 1982 [JP] Japan .................................. 57-45617

[51] Int. Cl.³ ............................................ G01N 23/00
[52] U.S. Cl. .................................................. 250/492.2
[58] Field of Search ............ 250/492.2, 492.1, 492.3, 250/423 R, 424; 313/359.1, 361.1

[56] References Cited

U.S. PATENT DOCUMENTS 3,689,766 9/1972 Freeman .......................... 250/492.2
4,013,891 3/1977 Ko et al. .......................... 250/492.2
4,316,090 2/1982 Sakudo et al. ................... 250/423 R
4,449,051 5/1984 Berkowitz ........................ 250/492.2

FOREIGN PATENT DOCUMENTS 80107965.8 12/1980 European Pat. Off. ......... 250/492.2

Primary Examiner—Alfred E. Smith
Assistant Examiner—Richard Hanig
Attorney, Agent, or Firm—Antonelli, Terry & Wands

[57] ABSTRACT

A non-mass-analyzed ion implantation process wherein two or more species of ions of the same polarity having greatly different ion masses are generated from a compound source material, the ions are accelerated under the application of an electric field, and the accelerated ions are scanned under the application of a magnetic field so as to be implanted into a target at a distribution profile which varies with the species of ions. An ion implantation apparatus can be simplified. A large ion beam current with a large spot size can be used and ions can be implanted to the target at a large dose within a short time. Especially, the non-mass-analyzed ion implantation is advantageously utilized for production of solar batteries.

19 Claims, 3 Drawing Figures

NON-MASS-ANALYZED ION IMPLANTATION

CROSS REFERENCE TO RELATED APPLICATION

This application relates to the subject matter disclosed in U.S. patent application Ser. No. 375,583 assigned to Hitachi Ltd. and claiming priority on a Japanese patent application entitled "Ion Implanting Apparatus" filed on May 18, 1981, invented by one of the present inventors and others.

BACKGROUND OF THE INVENTION

1. Field of the Invention

This invention relates to ion implantation and more particularly to a non-mass-analyzed ion implantation process wherein ions of non-selected species are accelerated and implanted into a target.

2. Description of Prior Art

Today, ion implantation is evaluated as one of important techniques, especially, in the semiconductor industry. Conventionally, most ion implantation apparatus for processing semiconductors have been based on mass-analyzed ion implantation wherein mass analysis is effected by utilizing a static magnetic field generated by a magnet and an ion of one selected species is used as an ion source. The mass-analyzed ion implantation has an advantage of high purity of implanted impurities but it requires a mass analyzer and suffers from a disadvantage that the apparatus is costly and running cost is high.

On the other hand, non-mass-analyzed ion implantation has been proposed especially for formation of a pn junction of solar batteries and it eliminates the above disadvantage (Japanese Patent Application Kokai (Laid-Open) No. 130975/78). In the non-mass-analyzed ion implantation, ions are accelerated and without being subjected to mass analysis, implanted into a target. This ion implantation process dispenses with the mass analyzer so that not only apparatus cost and running cost can be reduced but also travel path of ion beams can be reduced to reduce loss of ions due to collision and scattering of the ion beams at the inner wall of the apparatus. The reduction in loss leads to an increase in implantation current which in turn increases implantation processing speeds.

The conventional non-mass-analyzed ion implantation, however, simply implants all the ions of nonselected species into the target and has difficulties with the use of compound source materials. Further, even with an elemental source material such as for example red phosphorus, a phosphorus vaporizer is required and it is necessary to prevent solidification of vaporized phosphorus by heating an atmosphere between the phosphorus vaporizer and the ion source up to about 400° C.

SUMMARY OF THE INVENTION

It is an object of this invention to provide an ion implantation process which can use compounds as a source material without selecting ion species in advance.

According to one aspect of this invention, ion beams containing ions of different species and electrically accelerated are scanned magnetically to obtain, on a target surface, a distribution profile of implanted ion doses which depends on ion species. As the source material, a hydrogen compound is most preferably used which has a large ion mass ratio among ion species and which is easy to handle. As the source material adapted for a silicon target, phosphine $PH_3$ or arsine $AsH_3$ is most preferably used. Diborane $B_2H_6$ or the like may also be used.

For ion beam scanning, a magnetic scanning system suitable for handling large ion beam currents of a large spot size is preferably used.

Other objects, features and advantages of this invention will become apparent from the following detailed description taken in conjunction with the accompanying drawing.

DESCRIPTION OF THE PREFERRED EMBODIMENTS

A brief description will first be given of ion implantation by way of doping a semiconductor. To dope a semiconductor of a group IV element such as silicon, a group III element such as boron B or aluminum Al is typically used as a p-conductivity dopant and a group V element such as phosphorus or arsenic As is typically used as an n-conductivity dopant. In the ion implantation, either an ion of any one of these elements or ions containing any of these elements are implanted into the semiconductor. The ion for this purpose is typically produced by ionization of an impurity source of a compound by heating or discharging.

Figure 1:
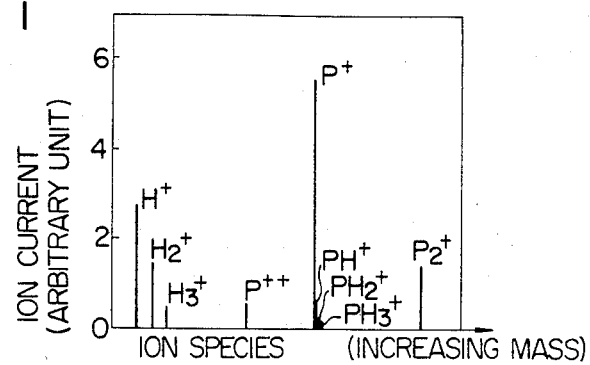
FIG. 1 is a spectrum diagram of ion beams produced with a microwave ion source.
Figure 2:
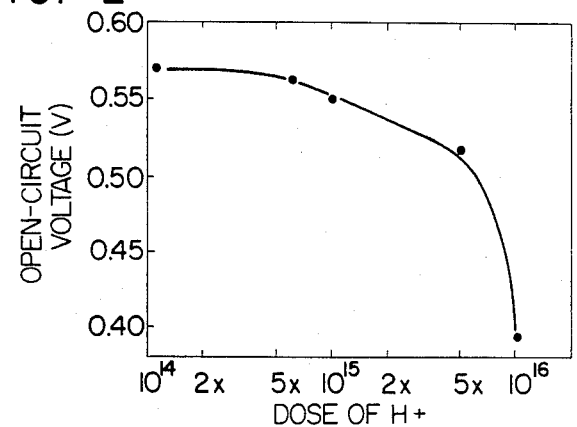
FIG. 2 is a graph showing influence of the dose of implanted $H^+$ ion upon open-circuit voltage of a solar battery.

For example, when a discharge gas of $PH_3$ is used, ion species as shown in FIG. 1 are produced, where abscissa represents mass(m)/charge(q) (arbitrary scale). It is revealed in FIG. 1 that in addition to a $P^+$ ion, $P_2^+$, $P^{++}$, $PH^+$, $PH_2^+$, $PH_3^+$, $H^+$, $H_2^+$ and $H_3^+$ ions are produced. According to the mass-analyzed ion implantation, the $P^+$ ion is selectively used, whereas according to the non-mass-analyzed ion implantation, all the ions are implanted into the semiconductor substrate simultaneously. Superposed implantation of other ions than the $P^+$ ion upon $P^+$ ion implantation was experimented through the mass-analyzed ion implantation process to examine what influence other ion species than the $P^+$ ion have upon solar battery characteristics. It was revealed by the experiment that ions such as $P_2^+$, $P^{++}$, $PH^+$, $PH_2^+$ and $PH_3^+$ containing phosphorus would be used efficiently as the impurity source. However, experimental results showed that implantation of $H^+$ ion, at an implantation energy of 33 KeV and at an annealing temperature of 850° C. conducted for 30 minutes particularly, had a greatly adverse influence. In this connection, one may refer to Digest of Technical Papers of 2nd Photovoltaic Science Engineering Conference in Japan, 1980, IP-2, page 2 by H. Itoh et al. The adverse influence of the $H^+$ ion implantation was observed in the solar battery characteristics, particularly, open-circuit voltage (Voc) and controlling the dose of implanted $H^+$ ion was proven to be necessary.

To study the reason of the adverse influence, transmission electron microscope observation and DLTS (Deep Level Transient Spectroscopy) measurement were conducted to find that the implanted H+ ions were vaporized from the crystalline substrate by approximately 100% at a temperature of 700° C. or more but damage in the crystal caused by the H+ ion implantation created, after annealing, crystal lattice defects and trapping centers which were localized near the junction.

It will thus be appreciated that in some cases, the implantation of non-selected ion species into the target leads to unfavorable results. It has therefore been desired to solve the problems set forth above by taking advantage of the non-mass-analyzed ion implantation which is advantageous in that ions can be implanted into the target at a high dose within a short time with a simplified apparatus.

Generally, ions of different ion species have different charges or masses. When generated ions of different species are accelerated under the application of an electric field, ions of one polarity are selected to produce ion beams which contain various ion species as shown in FIG. 1.

When an electromagnetic field is applied to the ion beams, the different ion species are subjected to different influence by the electromagnetic field. Typically, when a magnetic field is applied in a direction transverse to a travelling direction of the ion beams, ions are acted on by Lorentz force in a direction which is vertical to both the travelling and magnetic field directions and they are dispersed in accordance with values of q/m. By scanning the magnetic field, different ion species can be scanned over different scanning lengths.

The ratio of scanning length between two ion species of equal charge can be so approximated as to be in inverse proportion to a square root of the mass ratio. Thus, percentage of an ion having a large mass increases at the central area of scanning whereas percentage of an ion having a small mass increases at the periphery of scanning. For example, when a univalent ion of 100 mass is scanned over a width of 1 cm, a univalent ion of 1 (one) mass is considered to be scanned over approximately 10 cm width.

It is now assumed that a compound containing boron B and fluorine F is ionized to produce a univalent boron ion and a univalent fluorine ion. Since boron B and fluorine F have an atomic weight of about 10.8 and an atomic weight of about 19.0, respectively, the ratio of scanning width will be about $\sqrt{19.0/10.8} \approx \sqrt{1.76} \approx 1.33$. With a target placed at the center of scanning width, the fluorine ion will be implanted at a greater dose than the boron ion but with the target placed at one end region of scanning width, the dose of the implanted ions will be reversed. For phosphor P and fluorine F, the mass ratio is about 1.63 and the ratio of scanning width will become about 1.28. In this manner, for the mass ratio being about 1.6 or more, a ratio of scanning width of about 30% or more can be obtained.

For arsenic and fluorine, the mass ratio is about 3.9 and the scanning width ratio is about 2, indicating that the mass ratio being about 4 or more will provide a scanning width ratio of about 2 or more. Predictably, the dose of implanted fluorine will be approximately halved with the target placed at the center of scanning width as compared to the dose obtained by the implantation without being subjected to scanning.

Halogen compounds are corrosive and difficult to handle. Hydrogen compounds are less corrosive and easy to handle and besides, they have a large ion mass ratio.

A univalent boron ion and a univalent hydrogen ion both generated from diborane $B_2H_6$ will provide a mass ratio of about 10.8 and a scanning width ratio of about 3.29. Thus, with these ions, the dose of implanted hydrogen ion at the center can be about $\frac{1}{3}$ or less.

A univalent phosphorus ion and a univalent hydrogen ion generated from phosphine $PH_3$ will provide a mass ratio of about 31 and a scanning width ratio of about 5.6.

With arsine $AsH_3$, univalent arsenic and hydrogen ions generated therefrom will provide a mass ratio of about 75 and a scanning width ratio of about 8.6.

With phosphine and arsine capable of providing a mass ratio of 25 or more, impurity ion may efficiently be implanted into a semiconductor target and the dose of implanted hydrogen ion may be made about 1/5 or less by matching the width of the target within the scanning width of a univalent phosphorus ion or of a univalent arsenic ion.

Thus, due to the scanning of ion beams according to the present invention, damage in the semiconductor due to H+ ion implantation as described hereinbefore can be mitigated greatly and also distribution of implanted ions in the target can be made uniform.

The non-mass-analyzed ion implantation can be used with a large ion current. To make use of this advantage efficiently, such an ion source as a microwave ion source capable of readily providing a large ion current may preferably be used but the type of the ion source is not limited thereto.

The center of the scanning width is matched to preferential implantation of heavy ions and the periphery of the scanning width is matched to preferential implantation of light ions.

Scanning of ion beams can readily be effected by means of an electromagnet. The scanning can be done in various manners by changing current in an alternating fashion, superimposing a DC bias or using a sawtooth or sinusoidal wave current.

Experimentally, ion beams were scanned by a magnetic field in the non-mass-analyzed ion implantation process to reveal that based on the difference in mass between a P+ ion and a H+ ion, the scanning width for a P+ ion beam could be made larger than for a H+ ion beam and the ratio between doses of implanted P+ ion and H+ ion could be a fraction or less. At the total dose of P being $5 \times 10^{15}$ cm$^{-2}$, it is possible to reduce the dose of H+ ion to $5 \times 10^{14}$ cm$^{-2}$ which is so minimal that adverse influence of the H+ ion implantation upon output characteristics of the solar battery can be neglected. Thus, utilizing the present invention, when ion implanting using $PH_3$ as the source gas the total dose of H+ ion can be $1 \times 10^{15}$ cm$^{-2}$ or less when the total dose of P ion is $1 \times 10^{15}$ to $3 \times 10^{16}$ cm$^{-2}$.

When implanting ions into a semiconductor substrate having a larger area than the beam spot size, the beam is scanned on the substrate and the substrate may be moved continuously in a direction vertical to the beam scanning direction, thereby making it possible to make uniform the dose in the substrate surface and to assure continuous processing.

Figure 3:
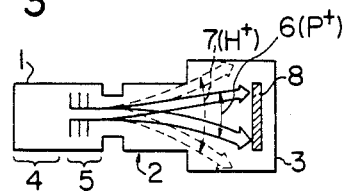
FIG. 3 is a schematic diagram of a magnetic field scanning type non-mass-analyzed ion implantation apparatus used for implementing an ion implantation process according to the invention.

The invention will now be described by way of example with reference to FIG. 3.

A target 8 was a p-conductivity silicon substrate of a resistivity of 3 Ω·cm and a non-mass-analyzed ion implantation apparatus comprised a microwave ion source 1, a beam scanning magnet section 2, and an implantation chamber 3. The ion source 1 includes an ion generating chamber 4 and an accelerating section 5. Acceleration energy was normally of the order of KeV or more. Magnets are disposed above and below the sheet of drawing and the target is moved vertically to the sheet of drawing. A discharge gas of $PH_3$ was used, ion beam was scanned so that the ratio between a beam current density not subject to the scanning and that subject to the scanning is about 0.6 to 0.7, and the total dose was set to $5 \times 10^{15}$ cm$^{-2}$. As diagrammatically shown in FIG. 3, the scanning width of $P^+$ ion is designated by reference numeral 6 and that of $H^+$ ion by 7. The ratio between the total dose and the dose of $H^+$ ion when not subjected to the beam scanning was 0.2 but it became 0.1 or less when subjected to the beam scanning. After the ion implantation, the target was annealed in an atmosphere of dry $N_2$ gas at a temperature of 850° C. to form an n+p junction. Electrodes were formed on front and rear surfaces of the target by printing, and an antireflection coating film was formed, thereby completing a solar battery. The thus prepared solar battery exhibits a conversion efficiency of 14 to 14.5% under a condition of AM1 solar simulator, which conversion efficiency is comparable to that of a solar battery prepared by the mass-analyzed ion implantation. This means that the adverse influence of $H^+$ ion implantation can substantially be eliminated. The term AM1 represents solar spectrum at earth's surface for optimum conditions at sea level, sun at Zenith.

For ion implantation into a 100 mmφ wafer, it usually takes 20 to several of tens of seconds in the case of the mass-analyzed ion implantation but several seconds in the case of the non-mass-analyzed ion implantation. This means that the wafer processing speed can be increased and the pn junction processing cost can be reduced. The discharge gas of a hydrogen compound used in this embodiment is easy to handle. Further, the scanning of ion beams by the magnetic field reduces the dose of $H^+$ ion as compared to the dose of dopant ion so that the adverse influence of $H^+$ ion implantation can be neglected. In addition, the beam scanning is effective to make uniform the ion implantation into the substrate.

The ion implantation apparatus which dispenses with the mass analyzer can be simplified and made inexpensive, and the elimination of a magnetic field generator for mass analysis can reduce the running cost. Further, the reduced ion beam travelling path can suppress reduction of beam current in the course of the travelling path, thus increasing the amount of beam current. Advantageously, the ion implantation processing speed can be increased and the processing cost can be reduced.

What is claimed is:

1. A non-mass-analyzed ion implantation process using ions generated from a compound without selecting a single ion species, comprising the steps of:
   generating ions, which include at least two species of ions of the same polarity, from a compound source material;
   accelerating said ions;
   scanning said accelerated ions electromagnetically and repetitively in a direction transverse to an acceleration direction; and
   implanting beams of said scanned ions, including said at least two species of ions, into a target, with said at least two species of ions being implanted with different distribution profiles of implanted ion doses.

2. A non-mass-analyzed ion implantation process according to claim 1 wherein said ions include at least two species of ions of the same polarity having different ion masses.

3. A non-mass-analyzed ion implantation process according to claim 2 wherein the mass ratio between said at least two species of ions is about 1.6 or more.

4. A non-mass-analyzed ion implantation process according to claim 2 wherein said mass ratio is about 3.9 or more.

5. A non-mass-analyzed ion implantation process according to claim 4 wherein said mass ratio is 25 or more.

6. A non-mass-analyzed ion implantation process according to claim 1 wherein said step of scanning comprises applying a magnetic field which varies periodically in a direction vertical to a travelling direction of the ion beams.

7. A non-mass-analyzed ion implantation process according to claim 1 wherein said compound comprises a hydrogen compound of one of group III and V elements.

8. A non-mass-analyzed ion implantation process according to claim 7 wherein said hydrogen compound comprises one of phosphine and arsine.

9. A non-mass-analyzed ion implantation process according to claim 7 wherein said step of generating ions comprises generating plasma discharge.

10. A non-mass-analyzed ion implantation process according to claim 1 wherein said step of accelerating comprises applying an electric field to said ions to apply said ions of one polarity with acceleration energy of the order of at least KeV.

11. A non-mass-analyzed ion implantation process according to claim 1 wherein said target is moved in a direction substantially vertical to the direction of scanning.

12. A non-mass-analyzed ion implantation process according to claim 2 wherein said compound comprises a hydrogen compound of one of group III and V elements, said at least two species of ions of the same polarity comprise a univalent ion of said one element and a univalent ion of hydrogen, and said target is placed within a range over which said univalent ion of said one element is scanned.

13. A non-mass-analyzed ion implantation process according to claim 1 wherein said scanning is performed to provide superposed and different scanning spans for said at least two species of ions.

14. A non-mass-analyzed ion implantation process according to claim 13 wherein said superposed and different scanning spans have a common central point.

15. A non-mass-analyzed ion implantation process according to claim 1 wherein, in said implanting, the at least two species of ions are implanted with superposed and different distribution profiles of implanted ion doses.

16. A non-mass-analyzed ion implantation process according to claim 1 wherein the ions are generated using a microwave ion source.

17. A method of producing a semiconductor device wherein one conductivity affording impurity is doped into a semiconductor substrate by non-mass-analyzed ion implantation, a discharge gas of a hydrogen compound of the impurity is used to generate ion beams which include at least H+ ion and ion of said impurity, and the generated ion beams including at least H+ ion and ion of said impurity are scanned by a magnetic field to cause superposed and different scanning spans for the H+ ion and ion of said impurity and reduce the dose of H+ relative to the dose of ion of the impurity.

18. A method of producing a semiconductor device according to claim 17 wherein said one conductivity impurity comprises one of As and P, and said discharge gas contains one of $AsH_3$ and $PH_3$.

19. A method of producing a semiconductor device according to claim 18 wherein the impurity is P and the discharge gas is $PH_3$, and the generated ion beams are scanned such that when the total dose of P is $1 \times 10^{15}$ to $3 \times 10^{16}$ cm$^{-2}$, the total dose of H+ ion is $1 \times 10^{15}$ cm$^{-2}$ or less.

* * * * *